(12) United States Patent
Lee et al.

(10) Patent No.: US 8,158,031 B2
(45) Date of Patent: Apr. 17, 2012

(54) METHOD FOR PREPARING METAL NANOPARTICLES USING METAL SEED AND METAL NANOPARTICLES COMPRISING METAL SEED

(75) Inventors: Kwi-Jong Lee, Hwaseong-si (KR); Hyun-Joo Song, Daejeon (KR); Dae-Ha Seo, Busan (KR); Jong-Wook Jung, Daegu (KR); Dong-Hoon Kim, Seongnam-si (KR)

(73) Assignee: Samsung Electro-Mechanics Co., Ltd., Gyunggi-Do (KR)

(*) Notice: Subject to any disclaimer, the term of this patent is extended or adjusted under 35 U.S.C. 154(b) by 271 days.

(21) Appl. No.: 12/437,634

(22) Filed: May 8, 2009

(65) Prior Publication Data

US 2010/0072434 A1    Mar. 25, 2010

(30) Foreign Application Priority Data

Sep. 25, 2008   (KR) .................. 10-2008-0094272

(51) Int. Cl.
*H01B 1/22* (2006.01)
(52) U.S. Cl. .......................................... 252/514; 75/362
(58) Field of Classification Search .................. 252/514; 75/362
See application file for complete search history.

(56) References Cited

U.S. PATENT DOCUMENTS

| | | | |
|---|---|---|---|
| 7,575,621 B2 * | 8/2009 | Vanheusden et al. | 75/351 |
| 7,648,654 B2 * | 1/2010 | Lee et al. | 252/512 |
| 7,749,299 B2 * | 7/2010 | Vanheusden et al. | 75/362 |
| 7,819,939 B1 * | 10/2010 | Yang et al. | 75/374 |
| 2004/0206942 A1 * | 10/2004 | Hsu | 252/500 |
| 2005/0142567 A1 * | 6/2005 | Su et al. | 435/6 |
| 2006/0083694 A1 * | 4/2006 | Kodas et al. | 424/46 |
| 2006/0159603 A1 * | 7/2006 | Vanheusden et al. | 423/1 |
| 2007/0151631 A1 * | 7/2007 | Fernandez Camacho et al. | 148/300 |
| 2008/0113178 A1 * | 5/2008 | Lazovsky et al. | 428/304.4 |
| 2009/0226357 A1 * | 9/2009 | Uzio et al. | 423/437.2 |

OTHER PUBLICATIONS

Uniform Silver Nanowires Synthesis . . . Sun et al. Chem. Mater. 2002, 14, 4736-4745.*
Evidence for Seed Mediated Nucleation . . . Nikhil et al. Chem. Mater. 2001, 13, 2313-2322.*
D. Garcia-Gutierrez et al., "HAADF study of Au-Pt core-shell bimetallic nanoparticles," Appl. Phys. A 79, 481-487 (2004).
Korean Office Action, w/ partial English translation thereof, issued in Korean Patent Application No. KR 10-20080094272 dated Sep. 29, 2010.
Tsuji, et al. "Rapid synthesis of silver nanostructures by using microwave-polyol method with the assistance of Pt seeds and polyvinylpyrrolidone." *Colloid Surface A*. 293. (2007): 185-194.
Chinese Office Action, with English translation, issued in Chinese Patent Application No. 200910158954.4, dated Aug. 5, 2011.
Korean Office Action, w/ partial English translation thereof, issued in Korean Patent Application No. KR 10-2008-0094272 dated May 31, 2011.

* cited by examiner

*Primary Examiner* — Mark Eashoo
*Assistant Examiner* — Mohammad Asdjodi
(74) *Attorney, Agent, or Firm* — McDermott Will & Emery LLP (57) ABSTRACT

It provides a method for preparing metal nanoparticles using a metal seed and metal nanoparticles including the metal seed, the method including: preparing a solution by adding a polymer surfactant in an alcohol solvent; heating the solution; forming a metal seed by adding a first metal salt of at least one metal salt selected from the group consisting of platinum, palladium and iridium in the heated solution; and adding a second metal salt into the solution including the metal seed. This method allows the production of uniform-sized nanoparticles under high concentration conditions in high yield and mass production in which the metal nanoparticles have high dispersion stability so that they are suitable for various application.

6 Claims, 11 Drawing Sheets

METHOD FOR PREPARING METAL NANOPARTICLES USING METAL SEED AND METAL NANOPARTICLES COMPRISING METAL SEED

CROSS-REFERENCE TO RELATED APPLICATIONS

This application claims the benefit of Korean Patent Application No. 10-2008-0094272 filed on Sep. 25, 2008, with the Korea Intellectual Property Office, the contents of which are incorporated here by reference in their entirety.

BACKGROUND

1. Technical Field

It relates to a method for preparing metal nanoparticles using a metal seed and metal nanoparticles including a metal seed.

2. Description of the Related Art

Chemical method, mechanical method and electrical method can be employed to produce gold nanoparticles. It is difficult to provide high pure particles due to impurities and to form uniform size of particles with the mechanical method using mechanical force to grind particles. The electrical method have some drawbacks such as a long period of manufacturing time and low yield. The chemical method can be divided to a vapor-phase method and a liquid-phase method. The vapor-phase method using plasma or vaporation requires use of expensive equipments. Thus, the liquid-phase method has been used widely to prepare uniform-sized particles in low production cost.

A well-known method for manufacturing gold nanoparticles is a non-aqueous method using thiol as a surfactant. This method allows the formation of uniform-sized gold nanoparticles but requires using of reducing agents and/or phase change materials which are environmentally unfriendly and costly. Further, thiol materials on the surface of particles cannot be easily removed and thus the particles may not be suitable for conductive inks.

On the other hand, typical aqueous methods, which are chloroauric acid ($HAuCl_4$) reduction in water which uses citric acid and chloroauric acid reduction using sodium borohydride ($NaBH_4$), provide uniform-sized nanoparticles. However, production yield is low so that they may not be suitable for mass production and even if particles are mass-produced, the dispersion stability is significantly decreased in high concentration of solutions.

In addition, methods for manufacturing gold nanoparticles using UV, NIR (near infrared ray), ultrasonics wave and microwave have been introduced but they still have problems of low production yield, production scale, ununiform energy transmission, etc to be solved.

SUMMARY

In order to resolve the problems described above, there is provided a method for preparing metal nanoparticles which allows mass production in high yield within a short period of time and controls the size of metal nanoparticles by adjusting reaction conditions. There is also provided metal nanoparticles which have uniform particle size and excellent dispersion stability in volatile solutions.

An aspect of embodiments is to provide a method for preparing metal nanoparticles including: preparing a solution by adding a polymer surfactant in an alcohol solvent; heating the solution; forming a metal seed by adding a first metal salt of at least one salt of a metal chosen from platinum, palladium and iridium in the heated solution; and adding a second metal salt into the solution including the metal seed.

Here, the polymer surfactant may be added by 1 to 100 equivalents to 1 equivalent of the second metal salt to be added and the first metal salt forming the metal seed may be added by 1 to $1/1000$ equivalents to 1 equivalent of the second metal salt to be added.

The solution may be heated at a temperature of from 100° C. to a boiling temperature of the solution.

The polymer surfactant may be polyvinylpyrrolidone or a copolymer including polyvinylpyrrolidone.

The first metal salt forming the metal seed may be at least one metal salt chosen from chloroplatinic acid ($H_2PtCl_6$), platinum chloride ($PtCl_4$), potassium hexachloroplatinate ($K_2PtCl_6$), sodium hexachloroplatinate ($Na_2PtCl_6$), palladium chloride ($PdCl2$), palladium iodide ($PdI_2$), palladium bromide ($PdBr_2$), palladium nitrate ($Pd(NO_3)_2$), palladium sulfate ($PdSO_4$), palladium(II) acetylacetonate, palladium(II) trifluoroacetate, iridium(III) chloride, iridium(III) acetylacetonate and iridium(III) bromide.

The second metal salt may be a salt of at least one metal chosen from gold, silver, copper and palladium. Examples thereof may include at least one metal salt chosen from chloroauric acid ($HAuCl_4$), bromoauric acid ($HAuBr_4$), potassium tetrachloroaurate ($KAuCl_4$) and sodium tetrachloroaurate ($NaAuCl_4$), silver nitrate ($AgNO_3$), silver acetate ($AgCH_3CO_2$), silver acetylacetonate, copper(II) chloride ($CuCl_2$), copper(II) nitrate ($Cu(NO_3)_2$), copper(II) sulfate ($CuSO_4$), palladium chloride ($PdCl_2$), palladium iodide ($PdI_2$), palladium bromide ($PdBr_2$), palladium nitrate ($Pd(NO_3)_2$), palladium sulfate ($PdSO_4$), palladium(II) acetylacetonate and palladium(II) trifluoroacetate.

The alcohol solvent may be at least one chosen from diethylene glycol, 1,5-pentanediol, tetraethylene glycol, ethylene glycol and triethylene glycol.

Another aspect of embodiments is to provide metal nanoparticles including a metal seed of a first metal chosen from platinum, palladium and iridium, wherein the metal seed is covered with a second metal and amount of the metal seed is 0.001 to 50 mol %.

Here, the second metal may be chosen from gold, silver, copper and palladium.

The metal nanoparticles may be prepared by the method described above.

Further another aspect of embodiments is to provide a nanoparticle colloidal solution including such metal nanoparticles and a nano ink including such metal nanoparticles.

Further another aspect of embodiments is to provide an interconnection pad and bio-sensor using the metal nanoparticles described above.

Additional aspects and advantages will be set forth in part in the description which follows, and in part will be obvious from the description, or may be learned by practice.

DETAILED DESCRIPTION

The method for preparing metal nanoparticles and metal nanoparticles prepared thereby will be described below in more detail.

First, a polymer surfactant may be added into an alcohol solvent to prepare a solution in manufacturing metal nanoparticles.

Here, the alcohol solvent may be used as a solvent and an organic reducing agent. Examples of the alcohol solvent may include diethylene glycol, 1,5-pentanediol, tetraethylene glycol, ethylene glycol, triethylene glycol and a mixture thereof, preferably diols such as diethylene glycol, 1,5-pentanediol and tetraethylene glycol, more preferably diethylene glycol.

The alcohol solvent may be added by 100 parts by weight to 2000 parts by weight, preferably 200 parts by weight to 1000 parts by weight, with respect to 100 parts by weight of a polymer surfactant. When it is less than 100 parts by weight, it may not sufficiently dissolve the polymer surfactant and when it is more than 2000 parts by weight, it may not be economical.

The polymer surfactant may be a polymer being able to function as a capping molecular which surrounds metal particles to grow them into nano-size stably in a solvent. Various polymer surfactants known to one skilled in the art may be used here. An example of the polymer surfactant may include polyvinylpyrrolidone and a copolymer including polyvinylpyrrolidone, which bind to metal nanoparticles to increase dispersion stability of the metal nanoparticles and provide high dispersity during re-dispersion process.

Size and shape of nanoparticles may be dependent on amount of the polymer surfactant when same reaction conditions and same kind of surfactant are used. When the amount of the polymer surfactant is used too little in the polyol process, size of the particles cannot be controlled and thus becomes overgrowth. On the other hand, when it is used too much, viscosity of the reaction solution increases, nanoparticles cannot be formed well, and even if they are formed, it is difficult to isolate and purity the nanoparticles formed.

The polymer surfactant is added by 1 to 1000 equivalents with respect to 1 equivalent of the second metal salt to be added. When it is added less than 1 equivalent, it may be difficult to control the size of particles and when it is used more than 1000 equivalent, it may not be economical due to excess use of the polymer surfactant. Thus, it may be used in a range of 1 equivalent to 100 equivalents with respect to 1 equivalent of the second metal salt to be added.

After preparing the solution, it may be heated to reduce a metal salt without using any reducing agent. The solution is heated at a temperature of from 100° C. to the boiling point of the solution, preferably from 240° C. to 250° C., to sufficiently reflux the polymer surfactant, metal salt and gold salt.

When the polyol is reduced by heating (the polyol process), heating to high temperature may be performed to oxidize the alcohol group of the polyol to the corresponding carboxylic group which results in reduction of metal ions. In case of gold and silver which get reduced well, it may be heated at about lower than 200° C. When methanol, ethanol or propanol, which have low boiling points, are used, such reduction may not occur. However, when a diol such as ethylene glycol, which has a high boiling point, is used, metal ions may be reduced. Such reduction may not occur at a temperature of lower than 100° C.

A salt of a first metal chosen from platinum, palladium and iridium may be added to the heated solution to create a metal seed. Here, the term "metal seed" is nanoparticles having much smaller particle size than the size of nanoparticles to form so that it helps the formation of desired nanoparticles (see FIG. 3)

The metal seed is used as a precursor prior to add a metal salt to reduce the size of metal nanoparticles and improve dispersity. It is noted that the metal seed, which has nano size and unstable surface, may accelerate a reduction rate of the metal salt and the accelerated reduction rate may play an important role in the formation of nanoparticles. Since the metal seed may be in the center of the metal nanoparticles, it may not function as a simple catalyst.

The first metal, which forms a metal seed, and the second metal, which forms nanoparticles by surrounding the metal seed, may have similar reduction potential. For example, platinum, palladium or iridium, which is used for the first metal, has similar reduction potential to gold (Au), which is used for the second metal. A metal having a similar reduction potential to the metal of desired nanoparticles may be used as a precursor.

According to an embodiment, the first metal salt forming a metal seed may be at least one metal salt chosen from chloroplatinic acid ($H_2PtCl_6$), platinum chloride ($PtCl_4$), potassium hexachloroplatinate ($K_2PtCl_6$), sodium hexachloroplatinate ($Na_2PtCl_6$), palladium chloride ($PdCl2$), palladium iodide ($PdI_2$), palladium bromide ($PdBr_2$), palladium nitrate ($Pd(NO_3)_2$), palladium sulfate ($PdSO_4$), palladium(II) acetylacetonate, palladium(II) trifluoroacetate, iridium(III) chloride, iridium(III) acetylacetonate and iridium(III) bromide, preferably platinum salt, more preferably chloroplatinic acid ($H_2PtCl_6$).

The first metal salt forming the metal seed may be added by 1 to 1/1000 equivalents with respect to 1 equivalent of the second metal salt to be added. When it is used less than 1/1000 equivalents, it may not sufficiently form metal seeds and thus cause no metal seed effect. On the other hand, when it is used more than 1 equivalent, it may not be economical since the metal is costly and may be difficult to isolate the formed nanoparticles.

A second metal salt is added to the solution, where the metal seed is formed, to form metal nanoparticles.

The second metal salt may be various if it can be used to manufacture metal nanoparticles.

According to an embodiment, the second metal may be one chosen from gold, silver, copper, palladium and a mixture thereof. Examples of the second metal salt may include chloroauric acid ($HAuCl_4$), bromoauric acid ($HAuBr_4$), potassium tetrachloroaurate ($KAuCl_4$), sodium tetrachloroaurate ($NaAuCl_4$), silver nitrate ($AgNO_3$), silver acetate ($AgCH_3CO_2$), silver acetylacetonate, copper(II) chloride ($CuCl_2$), copper(II) nitrate ($Cu(NO_3)_2$), copper(II) sulfate ($CuSO_4$), palladium chloride ($PdCl_2$), palladium idodide ($PdI_2$), palladium bromide ($PdBr_2$), palladium nitrate (Pd ($NO_3)_2$), palladium sulfate ($PdSO_4$), palladium(II) acetylacetonate, palladium(II) trifluoroacetate, and a mixture thereof.

Figure 1:
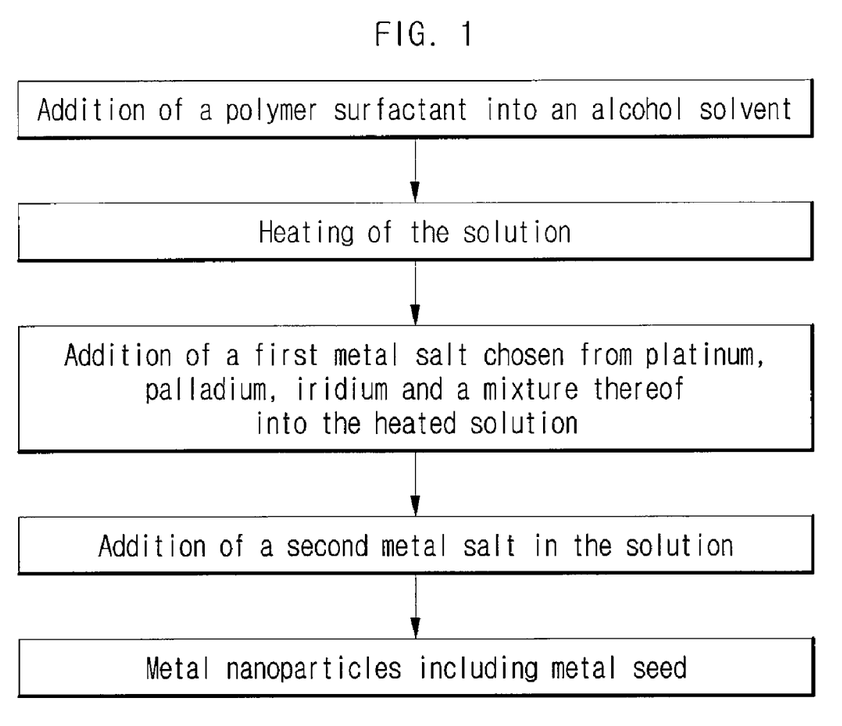
FIG. 1 is a flowchart illustrating a method for preparing metal nanoparticles according to an embodiment.
Figure 2:
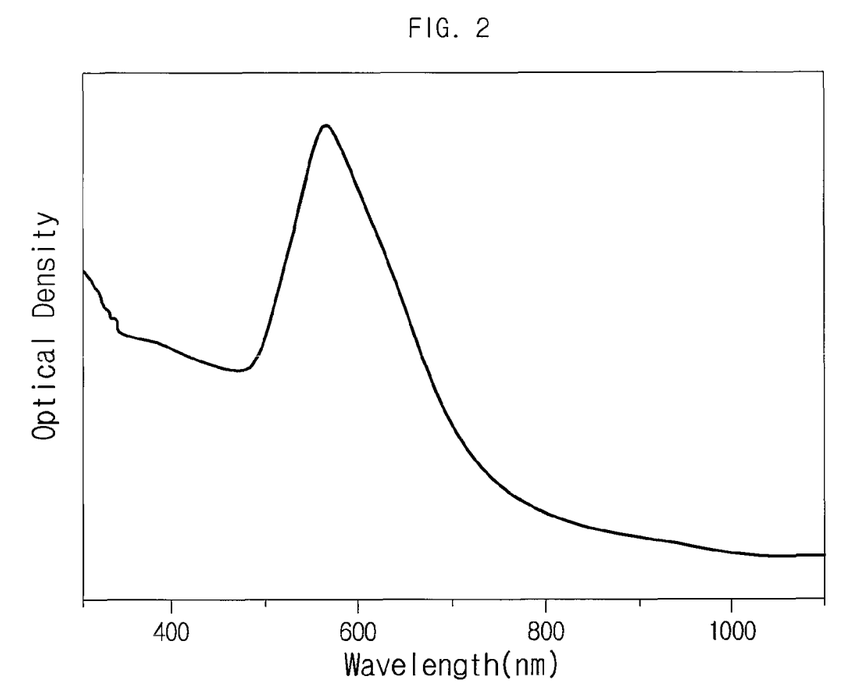
FIG. 2 is a graph of optical density determined by UV-Vis spectrophotometer illustrating the formation of gold nanoparticles in Example 1.

The reaction is performed promptly within about 5 minutes after the solution is heated. After the first metal salt chosen from at least one salt of platinum, palladium and iridium is added, the second metal salt is added 10 seconds later. As soon as the second metal salt is added, the solution color is changed, for example in case of gold, yellow color is changed to dark red or purple, and metal nanoparticles are formed. In case of forming gold nanoparticles, the formation of gold nanoparticles may be determined with a UV-Vis spectrophotometer showing plasmon resonance of gold particles at 590 nm (see FIG. 2). The less amount of the first metal salt is used, the bigger peak of metal nanoparticles is shown (see Examples 2 and 4)

In addition, when the polymer surfactant, the first metal salt and the second metal salt are added in to the heated solution at the same time, metal nanoparticles including metal seeds may be produced.

Another aspect of embodiments, there is provided metal nanoparticles including metal seed. The metal nanoparticles may include at least one metal seed chosen from platinum, palladium, and iridium and the second metal which surrounds the metal seed in which the metal seed is used by 0.001 to 50 mol %.

Here, the second metal is chosen from gold, silver, copper and palladium. Such metal nanoparticles may be manufactured by the method described above.

Figure 3:
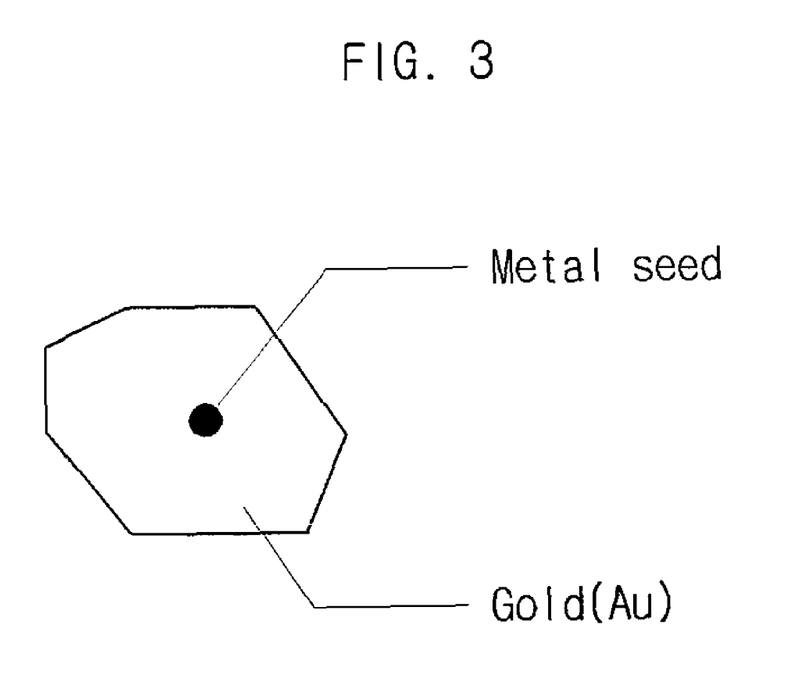
FIG. 3 is a cross-sectional view of gold nanoparticle according to an embodiment.

The metal seed may be in the center of the metal nanoparticle (see FIG. 3).

It may be determined if the metal nanoparticle contains the metal seed by energy dispersive spectroscopy analysis of a transmission electron microscope (TEM) and a scanning electron microscope (SEM), a X-Ray Fluorescence Spectrometer, and an induced coupled plasma-mass scepectroscopy (ICP-MS). Amount of metal may vary with amount of metal salt added during the manufacturing process.

The metal nanoparticles may have high dispersity in various solvents such as ethanol, isopropanol, 1-butanol, and ethylene glycol, except water.

Dispersion stability may be tested by various methods. For example, after the prepared metal nanoparticles are dispersed in a solvent, when the solution is centrifuged at higher than 1000 rpm for more than 5 minutes, it may determined it has good dispersion stability if any precipitate is not formed.

The metal nanoparticles prepared by the method described above have excellent dispersion stability so that they may be suitable for a collidal solution containing metal nanoparticles or a conductive nano ink containing metal nanoparticles. Further, the metal nanoparticles may be suitable for interconnection pads and bio-sensors.

Hereinafter, although more detailed descriptions will be given by examples, those are only for explanation and there is no intention to limit the invention.

In Examples, when the second metal was selected, 0.1 to 10 g of chloroauric acid or bromoauric acid was selected as a gold salt to manufacture gold nanoparticles in gram (g) and was dissolved in 4 mL of a solvent. Polyvinylpyrrolidone as a polymer surfactant was used 1 to 100 equivalent (0.5 to 50 g) based to 1 equivalent of the gold salt. 80 mL of diethylene glycol, 1,5-pentanediol or tetraethylene glycol was used as a solvent. Platinum was selected as a first metal and 1 to $10^{-3}$ M of chloroplatinic acid ($H_2PtCl_6$) or platinum chloride ($PtCl_4$) was used as the precursor of a platinum seed. Here, a ratio of platinum salt and gold salt was 1/1 to 1/1000. Gold nanoparticles were manufactured in various reaction conditions by the following Examples.

Example 1

40 g of polyvinylpyrrolidone was dissolved in diethylene glycol 80 mL and heated at 250° C. When the solution was boiled, 0.102 M chloroplatinic acid 0.5 mL was added. After 10 seconds, 1.270 M ($HAuCl_4$ 2.00 g) of a gold salt 4 mL was added. As soon as the gold salt was added to the solution, color was changed from yellow to dark red or purple and gold nanoparticles started to form.

The formation of gold nanoparticles was determined with a Uv-Vis spectrophotometer showing plasmon resonance of gold particles at 590 nm.

Example 2

Gold nanoparticles were manufactured by controlling amount of platinum salt to determine how amount of platinum salt affects the size of gold nanoparticles. Two solutions were prepared by dissolving 40 g of polyvinylpyrrolidone in diethylene glycol 80 mL and each solution was heated to 250° C. When the solution was boiled, $1.020 \times 10^{-1}$ M chloroplatinic acid 0.5 mL (Example 2a) and $1.020 \times 10^{-3}$ M chloroplatinic acid 0.5 mL (Example 2b) was added to each solution. After 10 seconds, 1.270 M ($HAuCl_4$ 2.00 g) of a gold salt 4 mL was added to each solution.

Figure 4:
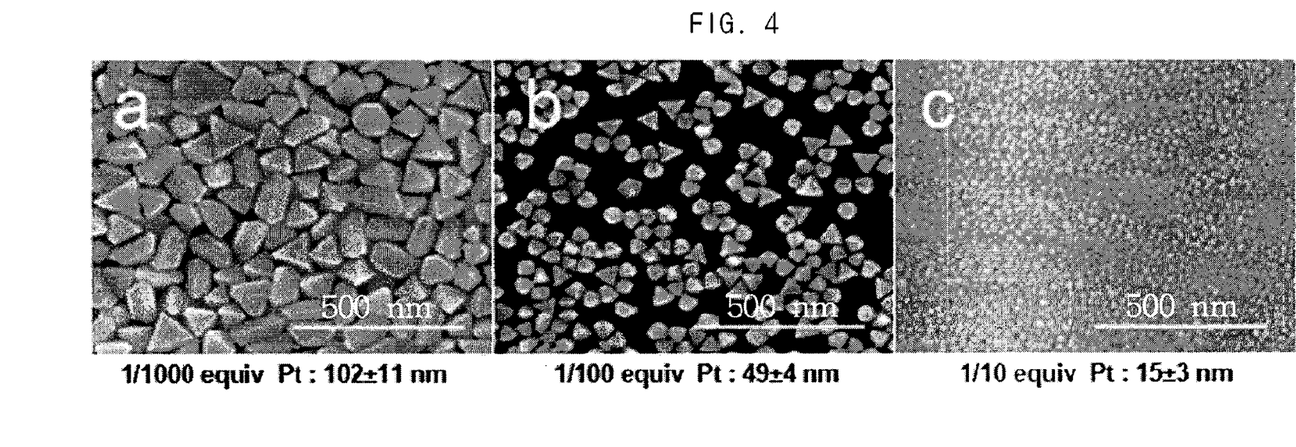
FIG. 4 is TEM images illustrating the size of gold nanoparticles with addition of platinum salt according to Example 2.

TEM (transmission electron microscope) images of gold nanoparticles manufactured according to Example 1, Example 2a and Example 2b are shown in FIG. 4 and size of gold nanoparticles according to amount of platinum salt is shown in Table 1.

TABLE 1

|  | Example 2a | Example 1 | Example 2b |
| --- | --- | --- | --- |
| Conc. of platinum salt | $1.020 \times 10^{-1}$ M | $1.020 \times 10^{-2}$ M | $1.020 \times 10^{-3}$ M |
| Platinum salt/gold salt ratio | 1/10 | 1/100 | 1/1000 |
| Size of gold nanoparticles | 15 (±3) nm | 49 (±3) nm | 102 (±5) nm |

Figure 5:
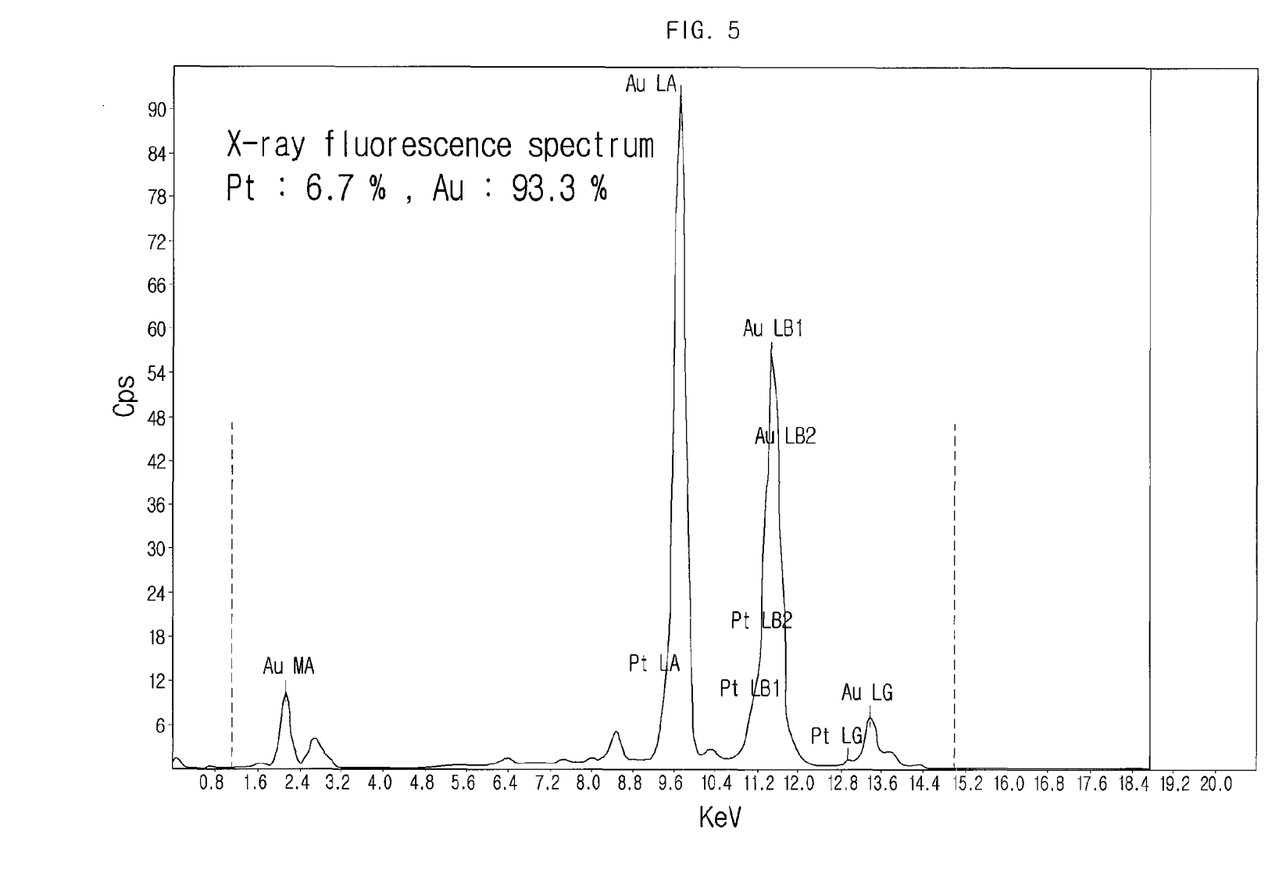
FIG. 5 is an X-ray fluorescence spectrum graph of gold nanoparticles according to Example 2a FIG. 6 is a TEM image of gold nanoparticles according to Example 3.

Elementary analysis of the manufactured gold nanoparticles was determined by inductively coupled plasma-mass spectroscopy (ICP-MS) and the result is shown in Table 2. The ICP-MS can determine up to 0.1% of a metal-content and practically up to 1/1000 equivalent. Existence of platinum in the gold nanoparticles was determined with an X-Ray Fluorescence Spectrometer and the result of the nanoparticles manufactured in Example 2a is shown in FIG. 5.

TABLE 2

| ICP-MS | Au | Pt | Pt/Au |
| --- | --- | --- | --- |
| 1/1000 equivalent (2b) | 94.5% | 0.1% | 0.11% |
| 1/100 equivalent (2a) | 81.2% | 0.6% | 0.74% |
| 1/10 equivalent | 93.3% | 6.7% | 7.18% |

Example 3

Figure 6:
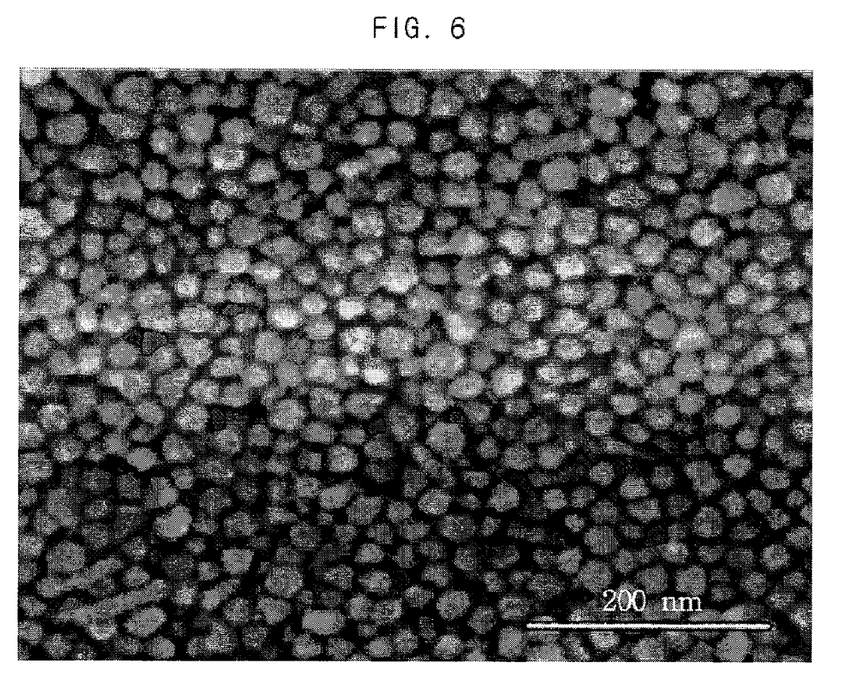

Gold nanoparticles were manufactured by controlling a method of adding the gold salt to avoid using excess amount of polyvinylpyrrolidone. 4 g of polyvinylpyrrolidone was dissolved in diethylene glycol 80 mL and heated at 250° C. When the solution was boiled, $1.020 \times 10^{-1}$ M chloroplatinic acid 0.5 mL was added. After 10 seconds, 1.270 M ($HAuCl_4$ 2.00 g) of a gold salt 0.4 mL was added every 30 seconds till 4 mL was added. A TEM image of the manufactured gold nanoparticles is shown in FIG. 6.

About 20 wt % of gold nanoparticle colloidal solution was determined for the dispersion stability in ethanol, isopropanol, 1-butanol, ethylene glycol and water. It showed high dispersion stability in all solvents, except water.

Example 4

Figure 7:
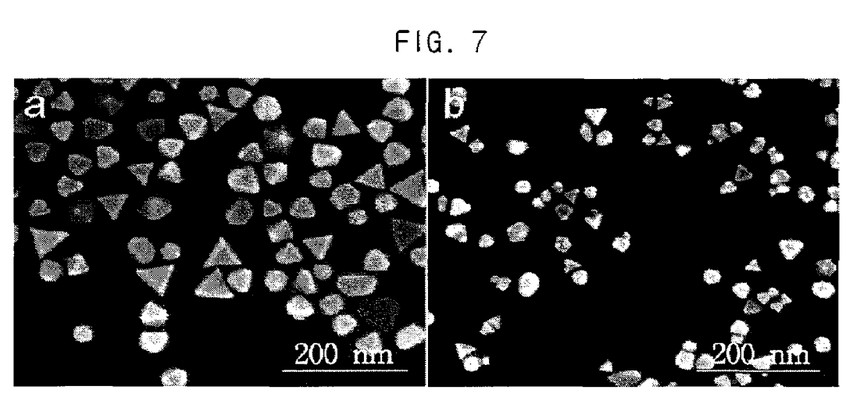
FIG. 7 is a TEM image of gold nanoparticles according to Example 4.

Gold nanoparticles were manufactured by controlling solvents. Various diol solvents were tested. 2 g of polyvinylpyrrolidone was dissolved in a solvent 4 mL and heated at 250° C. When the solution was boiled, $2.54 \times 10^{-2}$ M chloroplatinic acid 0.1 mL (1/100 equivalent to 1 equivalent of a gold salt) was added. After 10 seconds, 0.2 mL ($HAuCl_4$ 100 mg) of a gold salt was added. Here, the solvent was 1,5-pentanediol (Example 4a), tetraethylene glycol (Example 4b). A TEM image of the gold nanoparticles manufactured in each solvent was shown in FIG. 7.

Example 5

Figure 8:
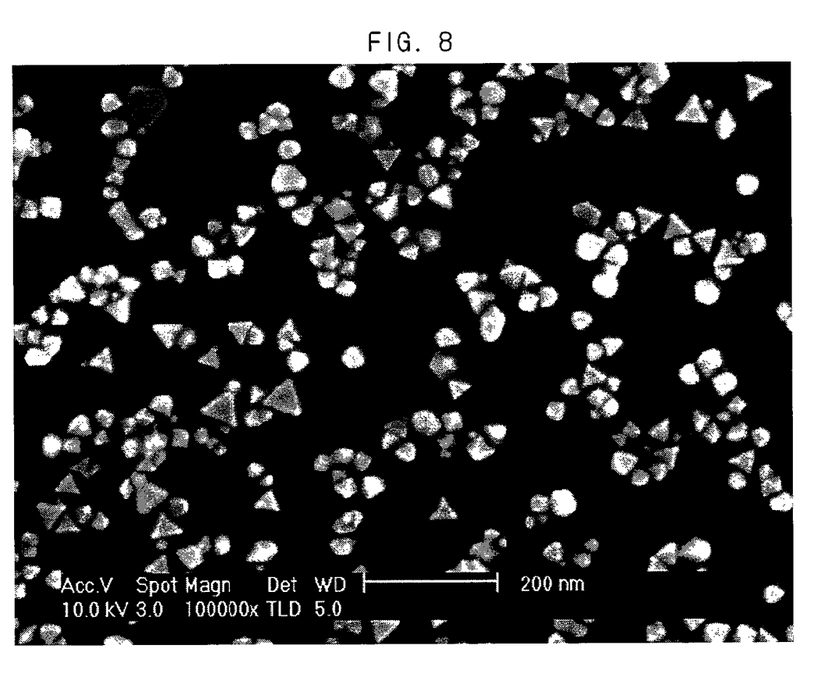
FIG. 8 is a TEM image of gold nanoparticles according to Example 5.

Gold nanoparticles were manufactured by controlling platinum salts. Different platinum salts were tested. 2 g of polyvinylpyrrolidone was dissolved in ethylene glycol 4 mL and heated at 250° C. When the solution was boiled, $2.54 \times 10^{-2}$ M platinum chloride ($PtCl_4$) 0.1 mL (1/100 equivalent to 1 equivalent of a gold salt) was added. After 10 seconds, 0.2 mL ($HAuCl_4$ 100 mg) of a gold salt was added. A TEM image of the gold nanoparticles manufactured by using the platinum chloride ($PtCl_4$) was shown in FIG. 8.

Example 6

Figure 9:
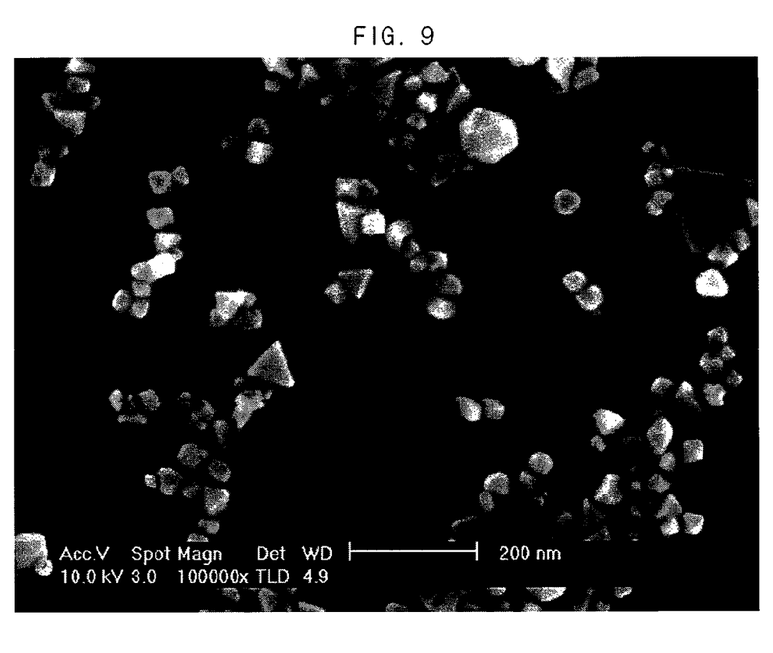
FIG. 9 is a TEM image of gold nanoparticles according to Example 6.

Gold nanoparticles were manufactured by controlling gold. A different gold salt was tested. 2 g of polyvinylpyrrolidone was dissolved in ethylene glycol 4 mL and heated at 250° C. When the solution was boiled, $2.54 \times 10^{-2}$ M chloroplatinic acid 0.1 mL was added. After 10 seconds, 0.2 mL ($HAuBr_4$ 100 mg) of a gold salt was added. A TEM image of the gold nanoparticles manufactured by using the bromoauric acid ($HAuBr_4$) was shown in FIG. 9.

Example 7

Figure 10:
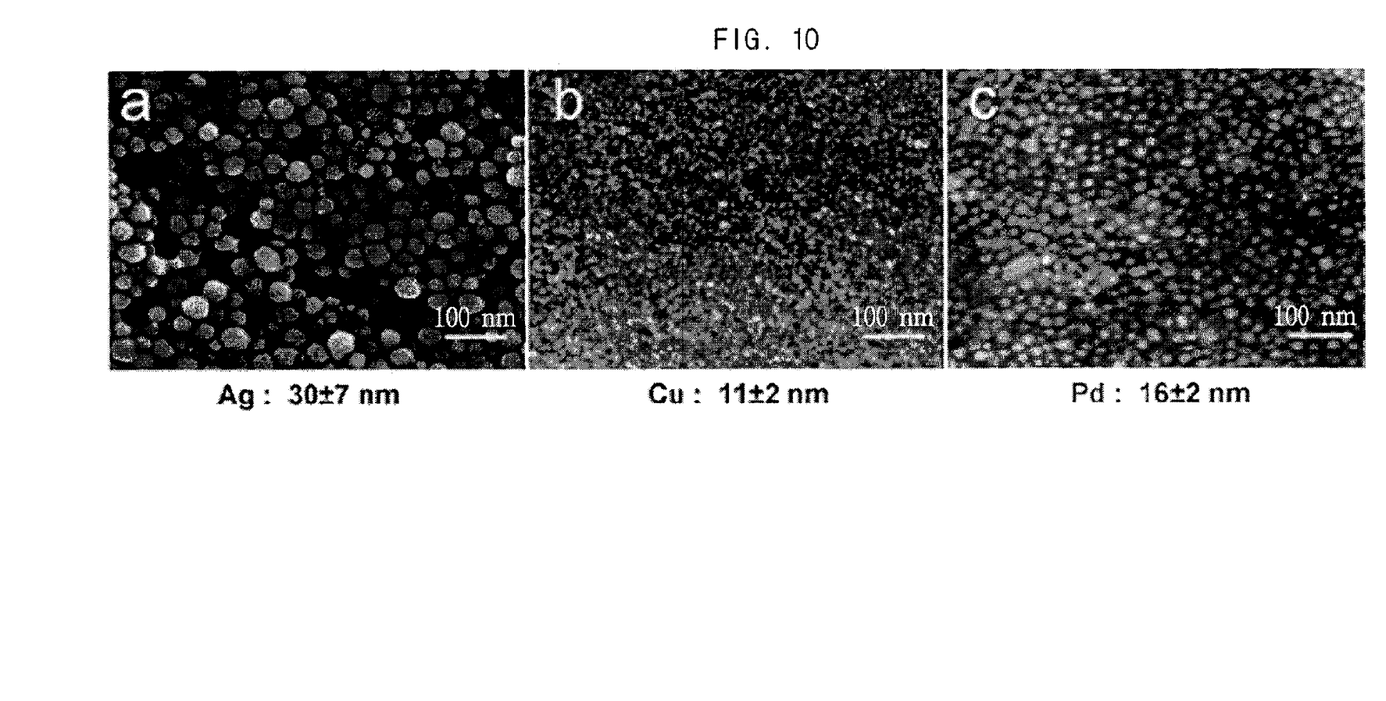
FIG. 10 is TEM images of silver, copper and palladium nanoparticles according to Example 7.

Nanoparticles were manufactured by controlling metals except gold to determine how platinum salt affects metals besides gold. 0.198 g of polyvinylpyrrolidone was dissolved in diethylene glycol 4.0 mL and heated at 250° C. When the solution was boiled, 0.127 M chloroplatinic acid 0.20 mL was added. After 10 seconds, each of 0.127 M ($AgNO_3$, 0.0431 g) of a silver salt 2.0 mL(Example 7a), 0.127 M ($CuSO_4$ 0.0405 g) of a copper salt 2.0 mL (Example 7b) and 0.127 M ($PdCl_2$ 0.0450 g) of palladium salt 2.0 mL (Example 7c) was added by adding 0.2 mL every 30 seconds. Each TEM image of the silver, copper and palladium nanoparticles was shown in FIG. 10.

Example 8

Figure 11:
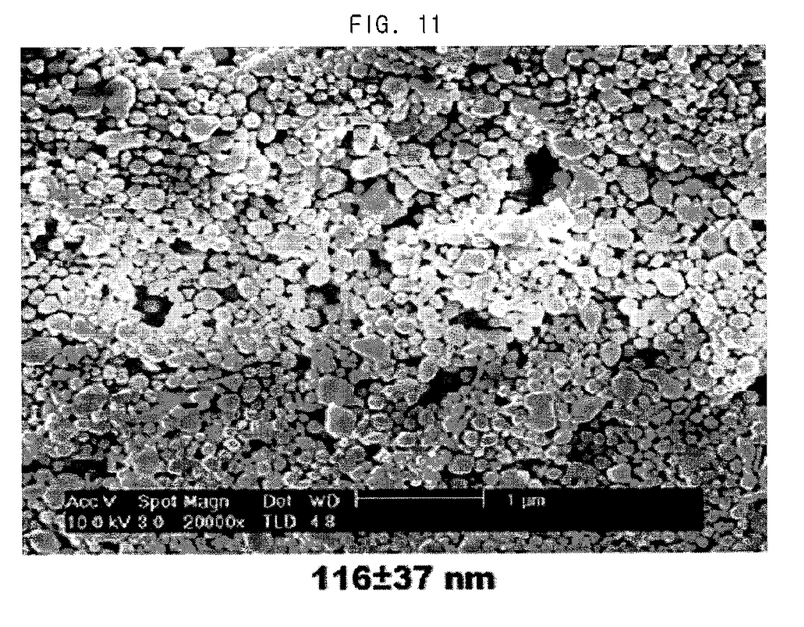
FIG. 11 is TEM image of gold nanoparticles according to Example 8.

Gold nanoparticles were manufactured by adding palladium salt instead of platinum salt. 0.198 g of polyvinylpyrrolidone was dissolved in diethylene glycol 4.0 mL and heated at 250° C. When the solution was boiled, 0.127 M palladium nitrate 0.20 mL was added. After 10 seconds, 0.127 M ($HAuCl_4$, 0.100 g) of a gold salt 2.0 mL was added by adding 0.2 mL every 30 seconds. A TEM image of the gold nanoparticles was shown in FIG. 11.

While it has been described with reference to particular embodiments, it is to be appreciated that various changes and modifications may be made by those skilled in the art without departing from the spirit and scope of the embodiment herein, as defined by the appended claims and their equivalents.

What is claimed is:

1. A method for manufacturing metal nanoparticles comprising:
preparing a solution by adding a polymer surfactant in an alcohol solvent;
heating the solution at a temperature of 100° C. to a boiling temperature of the solution;
forming a metal seed by adding a first metal salt of at least one metal salt selected from the group consisting of platinum, palladium and iridium in the heated solution; and
adding a second metal salt into the solution including the metal seed,
wherein the polymer surfactant is added by 1 to 100 equivalents with respect to 1 equivalent of the second metal salt to be added and the first metal salt forming the metal seed is added by 1 to 1/1000 equivalents with respect to 1 equivalent of the second metal salt to be added.

2. The method of claim 1, wherein the polymer surfactant is polyvinylpyrrolidone or a copolymer comprising polyvinylpyrrolidone.

3. The method of claim 1, wherein the first metal salt forming the metal seed is at least one metal salt selected from the group consisting of chloroplatinic acid ($H_2PtCl_6$), platinum chloride ($PtCl_4$), potassium hexachloroplatinate ($K_2PtCl_6$), sodium hexachloroplatinate ($Na_2PtCl_6$), palladium chloride (PdCl2), palladium iodide ($PdI_2$), palladium bromide ($PdBr_2$), palladium nitrate ($Pd(NO_3)_2$), palladium sulfate ($PdSO_4$), palladium(II) acetylacetonate, palladium(II) trifluoroacetate, iridium(III) chloride, iridium(III) acetylacetonate and iridium(III) bromide.

4. The method of claim 1, wherein the second metal salt is a salt of one metal selected from the group consisting of gold, silver, copper and palladium.

5. The method of claim 1, wherein the second metal salt is at least one metal salt selected from the group consisting of chloroauric acid ($HAuCl_4$), bromoauric acid ($HAuBr_4$), potassium tetrachloroaurate ($KAuCl_4$) and sodium tetrachloroaurate ($NaAuCl_4$), silver nitrate ($AgNO_3$), silver acetate ($AgCH_3CO_2$), silver acetylacetonate, copper(II) chloride ($CuCl_2$), copper(II) nitrate ($Cu(NO_3)_2$), copper(II) sulfate ($CuSO_4$), palladium chloride ($PdCl_2$), palladium iodide ($PdI_2$), palladium bromide ($PdBr_2$), palladium nitrate ($Pd(NO_3)_2$), palladium sulfate ($PdSO_4$), palladium(II) acetylacetonate and palladium(II) trifluoroacetate.

6. The method of claim 1, wherein the alcohol solvent is at least one selected from the group consisting of diethylene glycol, 1,5-pentanediol, tetraethylene glycol, ethylene glycol and triethylene glycol.

* * * * *